(12) United States Patent
Lin et al.

(10) Patent No.: US 12,557,646 B2
(45) Date of Patent: Feb. 17, 2026

(54) MULTI-DIE PACKAGE AND METHODS OF FORMATION

(71) Applicant: Taiwan Semiconductor Manufacturing Company, Ltd., Hsinchu (TW)

(72) Inventors: Wen-Yi Lin, New Taipei (TW); Kuang-Chun Lee, New Taipei (TW); Chien-Chen Li, Hsinchu (TW); Chien-Li Kuo, Hsinchu (TW); Kuo-Chio Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 668 days.

(21) Appl. No.: 17/823,856

(22) Filed: Aug. 31, 2022

(65) Prior Publication Data
US 2024/0071854 A1 Feb. 29, 2024

(51) Int. Cl.
*H01L 23/367* (2006.01)
*H01L 21/48* (2006.01)
(Continued)

(52) U.S. Cl.
CPC ........ *H01L 23/367* (2013.01); *H01L 21/4871* (2013.01); *H01L 21/563* (2013.01); *H01L 23/3157* (2013.01); *H01L 23/3737* (2013.01); *H01L 23/5383* (2013.01); *H01L 24/32* (2013.01); *H01L 25/18* (2013.01); *H01L 25/50* (2013.01); *H01L 23/49811* (2013.01); *H01L 24/13* (2013.01); *H01L 24/16* (2013.01); *H01L 24/73* (2013.01); *H01L 24/81* (2013.01); *H01L 2224/13111* (2013.01);
(Continued)

(58) Field of Classification Search
CPC ............................................. H01L 23/34–4735
See application file for complete search history.

(56) References Cited

U.S. PATENT DOCUMENTS 6,337,510 B1 * 1/2002 Chun-Jen ............ H01L 25/0657
  257/E23.047
8,941,233 B1 * 1/2015 Ngai ................. H01L 21/76898
  257/706

(Continued)

*Primary Examiner* — Dale E Page
*Assistant Examiner* — Rohit Parthasarathy
(74) *Attorney, Agent, or Firm* — Harrity & Harrity, LLP

(57) ABSTRACT

Some implementations described herein a provide a multi-die package and methods of formation. The multi-die package includes a dynamic random access memory integrated circuit die over a system-on-chip integrated circuit die, and a heat transfer component between the system-on-chip integrated circuit die and the dynamic random access memory integrated circuit die. The heat transfer component, which may correspond to a dome-shaped structure, may be on a surface of the system-on-chip integrated circuit die and enveloped by an underfill material between the system-on-chip integrated circuit die and the dynamic random access memory integrated circuit die. The heat transfer component, in combination with the underfill material, may be a portion of a thermal circuit having one or more thermal conductivity properties to quickly spread and transfer heat within the multi-die package so that a temperature of the system-on-chip integrated circuit die satisfies a threshold.

20 Claims, 14 Drawing Sheets

(51) Int. Cl.
*H01L 21/56* (2006.01)
*H01L 23/00* (2006.01)
*H01L 23/31* (2006.01)
*H01L 23/373* (2006.01)
*H01L 23/498* (2006.01)
*H01L 23/538* (2006.01)
*H01L 25/00* (2006.01)
*H01L 25/18* (2023.01)

(52) U.S. Cl.
CPC .............. *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/16225* (2013.01); *H01L 2224/32145* (2013.01); *H01L 2224/73204* (2013.01); *H01L 2224/81411* (2013.01); *H01L 2224/81439* (2013.01); *H01L 2224/81444* (2013.01); *H01L 2224/81447* (2013.01); *H01L 2224/81455* (2013.01); *H01L 2224/81464* (2013.01)

(56) References Cited

U.S. PATENT DOCUMENTS

| | | | | |
|---|---|---|---|---|
| 9,269,700 B2* | 2/2016 | Koopmans | .............. | H01L 24/81 |
| 10,485,103 B1* | 11/2019 | Sunshine | .......... | H01L 23/49838 |
| 10,790,216 B2* | 9/2020 | Costa | .................. | H01L 23/3737 |
| 2004/0238934 A1* | 12/2004 | Warner | ............... | H01L 23/3114 |
| | | | | 257/E23.092 |
| 2005/0224955 A1* | 10/2005 | Desai | .................... | H01L 23/433 |
| | | | | 257/E23.101 |
| 2008/0093733 A1* | 4/2008 | Hsu | ...................... | H01L 23/3128 |
| | | | | 257/722 |
| 2011/0128711 A1* | 6/2011 | Yim | ....................... | H05K 1/181 |
| | | | | 29/860 |
| 2012/0007229 A1* | 1/2012 | Bartley | ................... | H01L 23/14 |
| | | | | 438/122 |
| 2012/0045871 A1* | 2/2012 | Lee | ...................... | H01L 23/3677 |
| | | | | 257/E21.502 |
| 2014/0131900 A1* | 5/2014 | Haba | ...................... | H01L 21/56 |
| | | | | 438/126 |
| 2014/0367867 A1* | 12/2014 | Lin | ......................... | H01L 24/19 |
| | | | | 257/777 |
| 2017/0236804 A1* | 8/2017 | Hembree | ............ | H01L 23/3675 |
| | | | | 257/712 |
| 2017/0345794 A1* | 11/2017 | Yu | ........................ | H01L 25/0657 |
| 2018/0108592 A1* | 4/2018 | Hembree | ............ | H01L 23/367 |
| 2019/0067157 A1* | 2/2019 | Lin | ........................ | H01L 23/433 |
| 2019/0189577 A1* | 6/2019 | Chen | ...................... | H01L 24/05 |
| 2019/0378815 A1* | 12/2019 | Heikkinen | ............ | H10F 39/018 |
| 2020/0058571 A1* | 2/2020 | Wang | ................... | H01L 23/3128 |
| 2022/0344235 A1* | 10/2022 | Hayes | ................. | H01L 21/4871 |
| 2023/0061803 A1* | 3/2023 | Pan | ...................... | H01L 23/3736 |
| 2024/0071854 A1* | 2/2024 | Lin | ....................... | H01L 21/561 |

* cited by examiner

MULTI-DIE PACKAGE AND METHODS OF FORMATION

BACKGROUND

Various semiconductor device packaging techniques may be used to incorporate one or more semiconductor dies into a semiconductor die package. In some cases, semiconductor dies may be stacked in a semiconductor die package to achieve a smaller horizontal or lateral footprint of the semiconductor die package and/or to increase the density of the semiconductor die package. Semiconductor device packaging techniques that may be performed to stack semiconductor dies in a semiconductor die package may include package on package (PoP), chip on wafer (CoW), wafer on wafer (WoW), and/or chip on wafer on substrate (CoWoS), among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
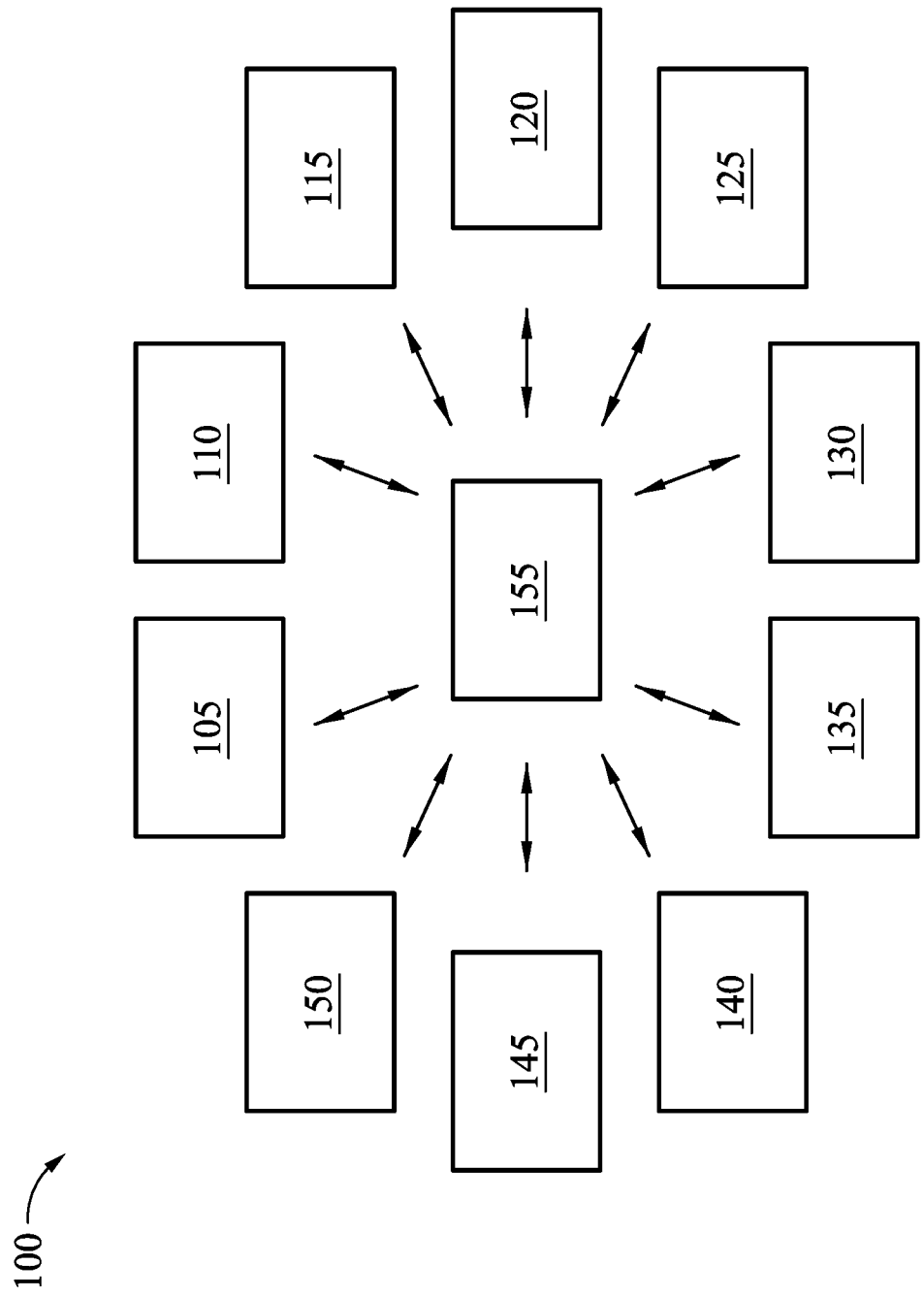
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as shown in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A multi-die package, such as an integrated fan-out (InFO) or package-on-package (PoP) multi-die package, may include a combination of stacked integrated circuit (IC) dies. For example, the multi-die package may include a dynamic random access memory (DRAM) IC die stacked over a system-on-chip (SoC) IC die. In some implementation and under certain power conditions, the SoC IC die generates heat.

The multi-die package may include an underfill material between the DRAM IC die and the SoC IC die. The underfill material may include one or more thermal properties, such as a thermal conductivity, a heat capacitance, and/or a heat spreading quality. The properties may be insufficient to form, within the multi-die package, a thermal circuit having a heat-transfer performance capable of quickly dissipating the heat generated by the SoC IC die so that the SoC IC die satisfies temperature-related performance threshold (e.g., a junction temperature above which the SoC IC die experiences a reduction in computing speed, among other examples). As a result, an application supported by the SoC IC die may not function. Additionally, or alternatively, a useful life of the SoC IC die in the field may be shortened.

Some implementations described herein provide a multi-die package and methods of formation. The multi-die package includes a DRAM IC die over an SoC IC die, and a heat transfer component between the SoC IC die and the DRAM IC die. The heat transfer component, which may correspond to a dome-shaped structure, may be on a surface of the SoC IC die and enveloped by an underfill material between the SoC IC die and the DRAM IC die. The heat transfer component, in combination with the underfill material, may form a portion of a thermal circuit having one or more thermal conductivity properties to quickly spread and transfer heat within the multi-die package so that a temperature of the SoC IC die satisfies a threshold.

The thermal circuit is configured to quickly spread and transfer heat within the multi-die package. In this way, heat is dissipated from the multi-die package so a temperature of the SoC IC die satisfies a junction temperature threshold. Satisfying the junction temperature threshold may increase a performance of the SoC IC die (e.g., a computing speed of the SoC IC die) and/or increase a reliability of the SoC IC die relative to another SoC IC die included in another multi-die package not including the heat transfer component.

FIG. 1 is a diagram of an example environment 100 in which systems and/or methods described herein may be implemented. As shown in FIG. 1, environment 100 may include a plurality of semiconductor processing tool sets 105-150 and a transport tool set 155. The plurality of semiconductor processing tool sets 105-150 may include a redistribution layer (RDL) tool set 105, a planarization tool set 110, an connection tool set 115, an automated test equipment (ATE) tool set 120, a singulation tool set 125, a die-attach tool set 130, an encapsulation tool set 135, a printed circuit board (PCB) tool set 140, a surface mount (SMT) tool set 145, and a finished goods tool set 150. The semiconductor processing tool sets 105-150 of example environment 100 may be included in one or more facilities, such as a semiconductor clean or semi-clean room, a semiconductor foundry, a semiconductor processing facility, an outsourced assembly and test (OSAT) facility, and/or a manufacturing facility, among other examples.

In some implementations, the semiconductor processing tool sets 105-150, and operations performed by the semiconductor processing tool sets 105-150, are distributed across multiple facilities. Additionally, or alternatively, one or more of the semiconductor processing tool sets 105-150 may be subdivided across the multiple facilities. Sequences of operations performed by the semiconductor processing tool sets 105-150 may vary based on a type of the semiconductor die package or a state of completion of the semiconductor die package.

One or more of the semiconductor processing tool sets 105-150 may perform a combination of operations to assemble a semiconductor die package (e.g., attach one or more IC dies to a substrate, where the substrate provides an external connectivity to a computing device, among other examples). Additionally, or alternatively, one or more of the semiconductor processing tool sets 105-150 may perform a combination of operations to ensure a quality and/or a reliability of the semiconductor die package (e.g., test and sort the one or more IC dies, and/or the semiconductor die package, at various stages of manufacturing).

The semiconductor die package may correspond to a type of semiconductor die package. For example, the semiconductor die package may correspond to a flipchip (FC) type of semiconductor die package, a ball grid array (BGA) type of semiconductor die package, a multi-chip package (MCP) type of semiconductor die package, or a chip scale package (CSP) type of semiconductor die package. Additionally, or alternatively, the semiconductor die package may correspond to a plastic leadless chip carrier (PLCC) type of semiconductor die package, a system-in-package (SIP) type of semiconductor die package, a ceramic leadless chip carrier (CLCC) type of semiconductor die package, or a thin small outline package (TSOP) type of semiconductor die package, among other examples.

The RDL tool set 105 includes one or more tools capable of forming one or more layers and patterns of materials (e.g., dielectric layers, conductive redistribution layers, and/or vertical connection access structures (vias), among other examples) on a semiconductor substrate (e.g., a semiconductor wafer, among other examples). The RDL tool set 105 may include a combination of one or more photolithography tools (e.g., a photolithography exposure tool, a photoresist dispense tool, a photoresist develop tool, among other examples), a combination of one or more etch tools (e.g., a plasma-based etched tool, a dry-etch tool, or a wet-etch tool, among other examples), and one or more deposition tools (e.g., a chemical vapor deposition (CVD) tool, a physical vapor deposition (PVD) tool, an atomic layer deposition (ALD) tool, or a plating tool, among other examples). In some implementations, the example environment 100 includes a plurality of types of such tools as part of RDL tool set 105.

The planarization tool set 110 includes one or more tools that are capable of polishing or planarizing various layers of the semiconductor substrate (e.g., the semiconductor wafer). The planarization tool set 110 may also include tools capable of thinning the semiconductor substrate. The planarization tool set 110 may include a chemical mechanical planarization (CMP) tool or a lapping tool, among other examples. In some implementations, the example environment 100 includes a plurality of types of such tools as part of the planarization tool set 110.

The connection tool set 115 includes one or more tools that are capable of forming connection structures (e.g., electrically-conductive structures) as part of the semiconductor die package. The connection structures formed by the connection tool set 115 may include a wire, a stud, a pillar, a bump, or a solderball, among other examples. The connection structures formed by the connection tool set 115 may include materials such as a gold (Au) material, a copper (Cu) material, a silver (Ag) material, a nickel (Ni) material, a tin (Sn) material, or a palladium (Pd) material, among other examples. The connection tool set 115 may include a bumping tool, a wirebond tool, or a plating tool, among other examples. In some implementations, the example environment 100 includes a plurality of types of such tools as part of the connection tool set 115.

The ATE tool set 120 includes one or more tools that are capable of testing a quality and a reliability of the one or more IC dies and/or the semiconductor die package (e.g., the one or more IC dies after encapsulation). The ATE tool set 120 may perform wafer testing operations, known good die (KGD) testing operations, semiconductor die package testing operations, or system-level (e.g., a circuit board populated with one or more semiconductor die packages and/or one or more IC dies) testing operations, among other examples. The ATE tool set 120 may include a parametric tester tool, a speed tester tool, and/or a burn-in tool, among other examples. Additionally, or alternatively, the ATE tool set 120 may include a prober tool, probe card tooling, test interface tooling, test socket tooling, a test handler tool, burn-in board tooling, and/or a burn-in board loader/unloader tool, among other examples. In some implementations, the example environment 100 includes a plurality of types of such tools as part of the ATE tool set 120.

The singulation tool set 125 includes one or more tools that are capable of singulating (e.g., separating, removing) the one or more IC dies or the semiconductor die package from a carrier. For example, the singulation tool set 125 may include a dicing tool, a sawing tool, or a laser tool that cuts the one or more IC dies from the semiconductor substrate. Additionally, or alternatively, the singulation tool set 125 may include a trim-and-form tool that excises the semiconductor die package from a leadframe. Additionally, or alternatively, the singulation tool set 125 may include a router tool or a laser tool that removes the semiconductor die package from a strip or a panel of an organic substrate material, among other examples. In some implementations, the example environment 100 includes a plurality of types of such tools as part of the singulation tool set 125.

The die-attach tool set 130 includes one or more tools that are capable of attaching the one or more IC dies or the semiconductor die package to the interposer, the leadframe, a dicing tape, and/or the strip of the organic substrate material, among other examples. The die-attach tool set 130 may include a pick-and-place tool, a taping tool, a reflow tool (e.g., a furnace), a laser tool, a soldering tool, or an epoxy dispense tool, among other examples. In some implementations, the example environment 100 includes a plurality of types of such tools as part of the die-attach tool set 130.

The encapsulation tool set 135 includes one or more tools that are capable of encapsulating the one or more IC dies (e.g., the one or more IC dies attached to the interposer, the leadframe, or the strip of organic substrate material). For example, the encapsulation tool set 135 may include a molding tool that encapsulates the one or more IC dies in a plastic molding compound. Additionally, or alternatively, the encapsulation tool set 135 may include a dispense tool that dispenses an epoxy polymer underfill material between the one or more IC dies and an underlying surface (e.g., the interposer or the strip of organic substrate material, among other examples). In some implementations, the example environment 100 includes a plurality of types of such tools as part of the encapsulation tool set 135.

The PCB tool set 140 incudes one or more tools that are capable of forming a PCB having one or more layers of electrically-conductive traces. The PCB tool set 140 may form a type of PCB, such as a single layer PCB, a multi-layer PCB, or a high density connection (HDI) PCB, among other examples. In some implementations, the PCB tool set 140 forms the interposer and/or the substrate using one or more layers of a buildup film material and/or fiberglass reinforced epoxy material. The PCB tool set 140 may include a laminating tool, a plating tool, a photoengraving tool, a laser cutting tool, a pick-and-place tool, an etching tool, a dispense tool, a bonding tool, and/or a curing tool (e.g., a furnace) among other examples. In some implementations, the example environment 100 includes a plurality of types of such tools as part of the PCB tool set 140.

The SMT tool set 145 includes one or more tools that are capable of mounting the semiconductor die package to a circuit board (e.g., a central processing unit (CPU) PCB, a memory module PCB, an automotive circuit board, and/or a display system board, among other examples). The SMT tool set 145 may include a stencil tool, a solder paste printing tool, a pick-and-place tool, a reflow tool (e.g., a furnace), and/or an inspection tool, among other examples. In some implementations, the example environment 100 includes a plurality of types of such tools as part of the SMT tool set 145.

The finished goods tool set 150 includes one or more tools that are capable of preparing a final product including the semiconductor die package for shipment to a customer. The finished goods tool set 150 may include a tape-and-reel tool, a pick-and-place tool, a carrier tray stacking tool, a boxing tool, a drop-testing tool, a carousel tool, a controlled-environment storage tool, and/or a sealing tool, among other examples. In some implementations, the example environment 100 includes a plurality of types of such tools as part of the finished goods tool set 150.

The transport tool set 155 includes one or more tools that are capable of transporting work-in-process (WIP) between the semiconductor processing tools 105-150. The transport tool set 155 may be configured to accommodate one or more transport carriers such a wafer transport carrier (e.g., a wafer cassette or a front opening unified pod (FOUP), among other examples), a die carrier transport carrier (e.g., a film-frame carrier, among other examples), and/or a package transport carrier (e.g., a joint electron device engineering (JEDEC) tray or a carrier tape reel, among other examples). The transport tool set 155 may also be configured to transfer and/or combine WIP amongst transport carriers. The transport tool set 155 may include a pick-and-place tool, a conveyor tool, a robot arm tool, an overhead hoist transport (OHT) tool, an automated materially handling system (AMHS) tool, and/or another type of tool. In some implementations, the example environment 100 includes a plurality of types of such tools as part of the transport tool set 155.

One or more of the semiconductor processing tool sets 105-150 may perform one or more operations described herein. For example, one or more of the semiconductor processing tool sets 105-150 may perform one or more operations described in connection with FIGS. 2A-6, among other examples. The one or more operations include attaching a substrate including a first semiconductor die package to a dicing tape. The one or more operations include forming a deposit of a thermally-conductive material on a top surface of the first semiconductor die package. The one or more operations include attaching a second semiconductor die package above the top surface of the first semiconductor die package, where a bottom surface of the second semiconductor die package and a top surface of the deposit are disconnected. The one or more operations include reforming the deposit into a dome-shaped structure, where the bottom surface of the second semiconductor die package and a curved top surface of the dome-shaped structure are disconnected. The one or more operations include forming an underfill material between the bottom surface of the second semiconductor die package and the top surface of the first semiconductor die package, where forming the underfill material envelops the dome-shaped structure.

The number and arrangement of tool sets shown in FIG. 1 are provided as one or more examples. In practice, there may be additional tool sets, different tool sets, or differently arranged tool sets than those shown in FIG. 1. Furthermore, two or more tool sets shown in FIG. 1 may be implemented within a single tool set, or a tool set shown in FIG. 1 may be implemented as multiple, distributed tool sets. Additionally, or alternatively, one or more tool sets of environment 100 may perform one or more functions described as being performed by another tool set of environment 100.

Figure 2A:
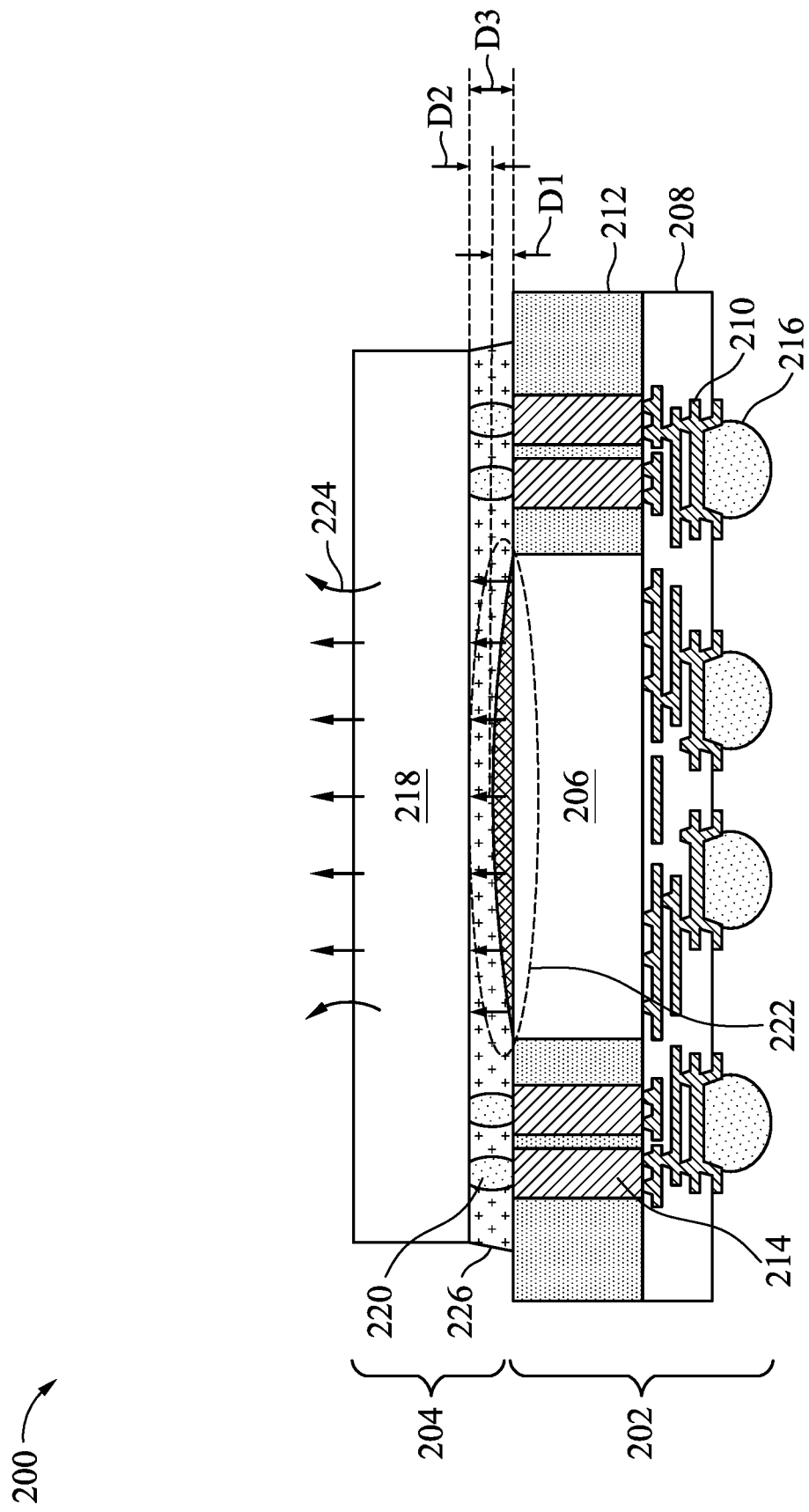
FIGS. 2A-2C are diagrams of example implementations of a multi-die package described herein.
Figure 2B:
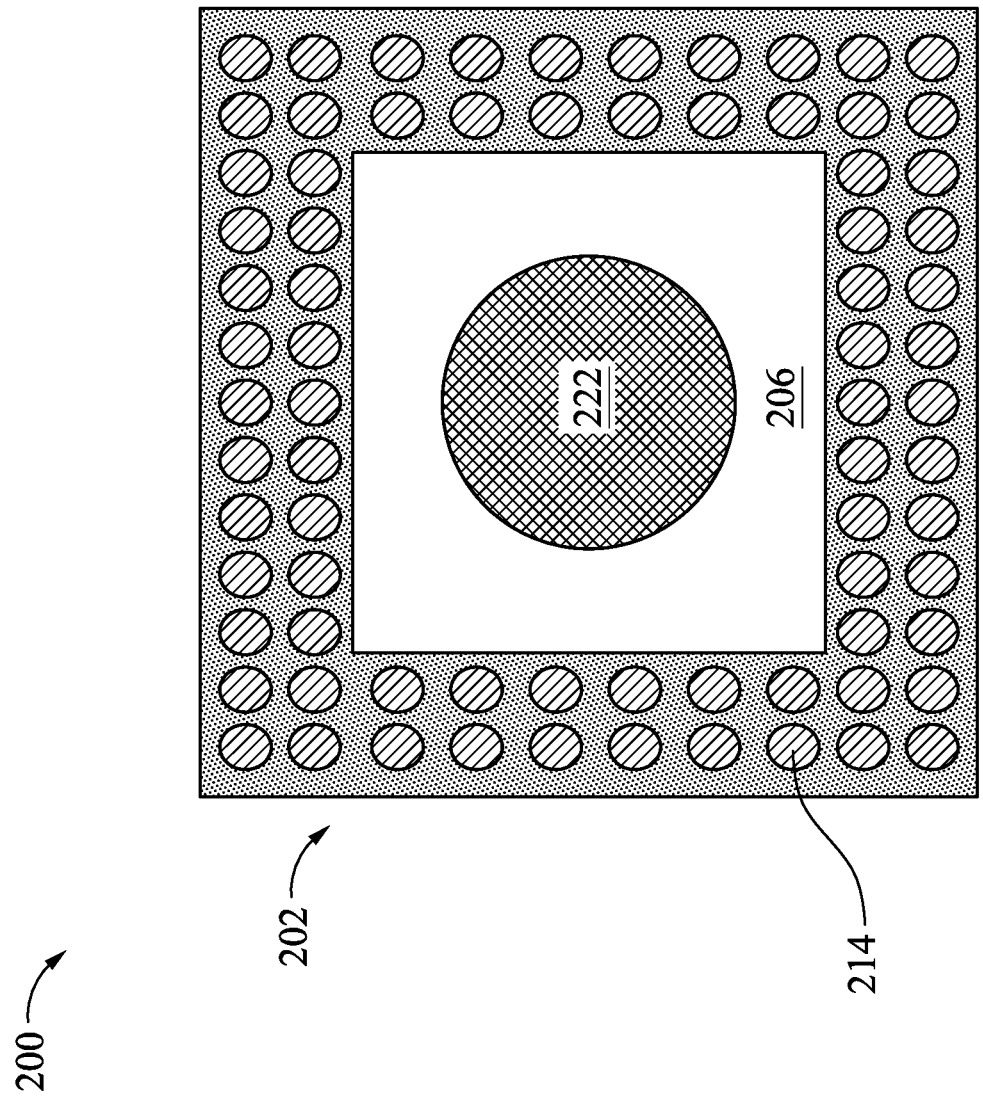
Figure 2C:
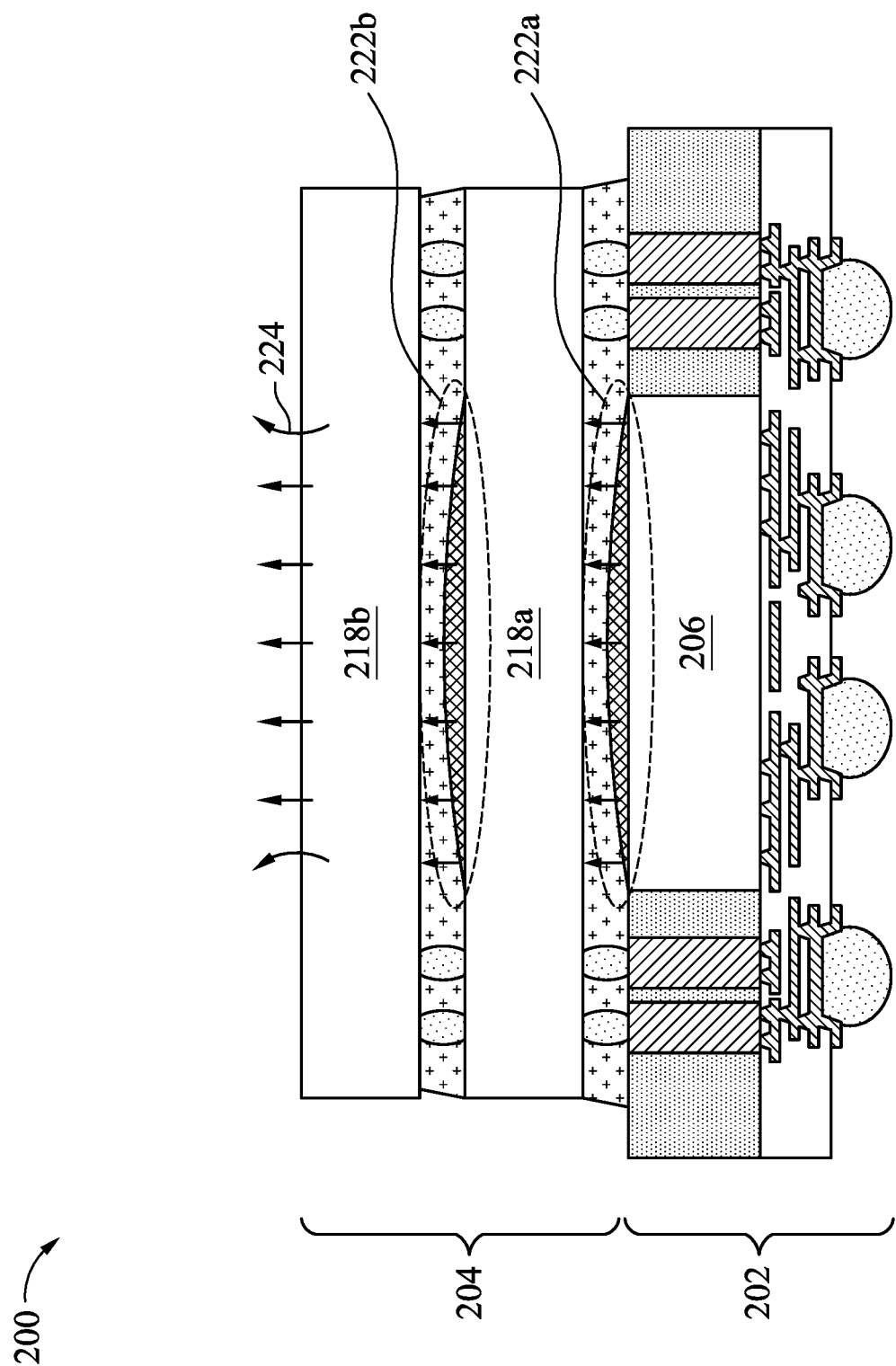

FIGS. 2A-2C are diagrams of a multi-die package 200 described herein. The multi-die package 200 includes a packaged semiconductor device that includes one or more semiconductor die packages. The multi-die package 200 may be referred to as a package on package (PoP) semiconductor die package, a 3D package, a 2.5D package, an integrated fanout (InFO) package, and/or another type of semiconductor die package that includes the one or more semiconductor die packages.

FIG. 2A illustrates a cross-section view of the multi-die package 200. As shown in FIG. 2A, the multi-die package 200 may include a semiconductor die package 202 (e.g., a bottom semiconductor die package) and a semiconductor die package 204 (e.g., a top semiconductor die package). The semiconductor die package 202 and the semiconductor die package 204 may be stacked or vertically arranged in the multi-die package 200. In particular, the semiconductor die package 204 may be included over the semiconductor die package 202.

The semiconductor die package 202 may correspond to an integrated fan-out package (e.g., an InFO package) that includes a semiconductor die, such as a system-on-chip (SoC) IC die 206 and/or another die, among other examples. The semiconductor die package 204 may correspond to a flip chip package or a bumped die package that includes a memory integrated circuit die, such as a dynamic random access memory (DRAM) IC die 218 and/or another type of IC die, among other examples. Each of the semiconductor die packages 202 and 204 may include one or more other structures, such as a substrate, an interposer, and/or connection structures, among other examples described herein.

The semiconductor die package 202 may include a redistribution structure 208 that includes one or more metallization layers 210. The one or more metallization layer 210 of may include one or more materials such as a gold (Au) material, a copper (Cu) material, a silver (Ag) material, a nickel (Ni) material, a tin (Sn) material, and/or a palladium (Pd) material, among other examples. The one or more metallization layers 210 of the redistribution structure 208 may include metal lines, interconnects, and/or another type of metallization layers that enable fanout of I/O connections on the semiconductor die packages 202 and 204. A dielectric material such as a polybenzoxazole (PBO) material, a polyimide material, a benzocyclobutene (BCB) material, a silicon oxide ($SiO_x$) material, and/or another suitable dielectric material may be dispersed between the one or more metallization layers 210.

The semiconductor die package 202 may include a mold compound 212 surrounding the SoC IC die 206 and one or more vertical interconnect access (via) structures 214 penetrating through the mold compound 212 (e.g., an encapsulant) to connect with the one or more metallization layers 210. The mold compound 212 (e.g., a polymer material, one or more fillers dispersed in a resin material, an epoxy-based resin material, or a plastic material, among other examples) may protect the SoC IC die 206 from damage during manufacturing operations and/or during a field use of the multi-die package 200. The via structures 214 may include a gold (Au) material, a copper (Cu) material, a silver (Ag) material, a nickel (Ni) material, a tin (Sn) material, and/or a palladium (Pd) material, among other examples.

The semiconductor die package 202 may further include connection structures 216. The connection structures 216, for attaching the multi-die package 200 (e.g., the multi-die package 200 including the semiconductor die package 204) to lands or pads of a printed circuit board (PCB) or another type of board structure, may include one or more combinations of a stud, a pillar, a bump, or a solderball, among other examples. The connection structures 216 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials included in the connection structures 216 may be lead-free (e.g., Pb-free).

The semiconductor die package 204 (e.g., the DRAM IC die 218) may be over the semiconductor die package 202. In some implementations, connection structures 220 connect the semiconductor die package 204 to the semiconductor die package 202. For example, and as shown in FIG. 2A, the connection structures 220 connect the semiconductor die package 204 to the via structures 214 of the semiconductor die package 202. In some implementations, the connection structures 220 include one or more combinations of a stud, a pillar, a bump, or a solderball, among other examples. The connection structures 220 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials included in the connection structures 220 may be lead-free (e.g., Pb-free).

The multi-die package 200 includes a dome-shaped structure 222. The dome-shaped structure 222, which may be located on a top surface of the semiconductor die package 202 (e.g., over the SoC IC die 206, among other examples), may include a thermally-conductive material. For example, the thermally-conductive material may include an epoxy solder paste material. Additionally, or alternatively, the thermally-conductive material may include a phase change material (PCM) with a thermally-conductive filler material.

Figure 3:
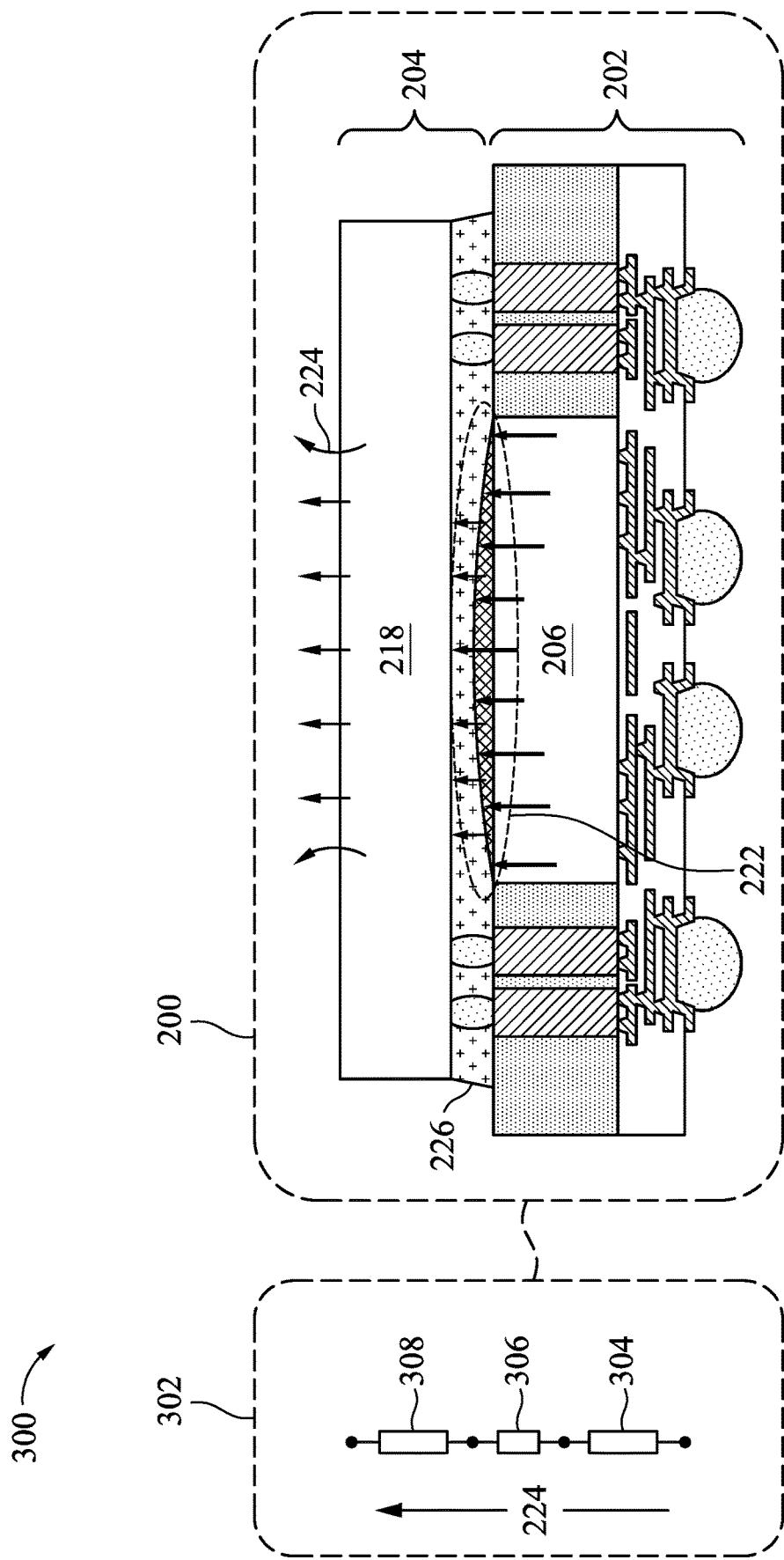
FIG. 3 is a diagram of an example implementation of the semiconductor die package described herein.

As described in greater connection with FIG. 3 and elsewhere herein, the dome-shaped structure 222 may be included as part of a thermal circuit. During operation (e.g., during a duty cycle) of the SoC IC die 206, the thermal circuit including the dome-shaped structure 222 spreads heat 224 emanating from the SoC IC die 206 and transfers the heat 224 to the DRAM IC die 218 for dissipation to an environment surrounding the multi-die package 200.

In some implementations, the dome-shaped structure 222 (e.g., the thermally-conductive material of the dome-shaped structure 222) includes a thermal-conductivity that is greater than or equal to approximately 65 watts per meter Kelvin (W/m·K). If the thermal-conductivity is less than approximately 65 W/m·K, the thermal circuit including the dome-shaped structure 222 may be insufficient to transfer heat from semiconductor die package 202 (e.g., the SoC IC die 206) at a targeted heat transfer speed or rate. However, other values and ranges for the thermal-conductivity are within the scope of the present disclosure.

As shown in FIG. 2A, the multi-die package 200 may include an underfill material 226 between a top surface of the semiconductor die package 202 and a bottom surface of the semiconductor die package 204. The underfill material 226 may include an epoxy polymer material, among other examples, to absorb thermal stresses and/or thermal strains within the multi-die package 200. By absorbing the thermal stresses and/or thermal strains, the underfill material 226 may improve a robustness of the multi-die package 200 (e.g., improves a solder joint reliability (SJR) between the connection structures 220 and the via structure 214, among other examples).

As shown in FIG. 2A, the underfill material 226 (e.g., a portion of the underfill material 226) may be disposed between an apex of the dome-shaped structure 222 and a bottom surface of the semiconductor die package 204 (e.g., the underfill material 226 may be disposed between an apex of the convex-shaped surface and the bottom surface of the semiconductor die package 204). Additionally, or alternatively, the underfill material 226 may envelop the dome-shaped structure 222. Additionally, or alternatively, the underfill material 226 may be between surfaces of the semiconductor die package 202 and the semiconductor die package 204.

Features of the multi-die package 200 may include one or more dimensional and/or geometric properties. For example, a thickness D1 of the dome-shaped structure 222 may be included in a range of approximately 10 microns to approximately 110 microns. If the thickness D1 is less than approximately 10 microns, an amount of the thermally-conductive material included in the dome-shaped structure 222 may be insufficient to transfer heat from semiconductor die package 202 (e.g., the SoC IC die 206) at a targeted heat transfer speed or rate. If the thickness D1 is greater than approximately 110 microns, the dome-shaped structure 222 may interfere with a bottom surface of the semiconductor die package 204 to reduce a reliability of solder joints between the via structures 214 and the connection structures 220. However, other values and ranges for the thickness D1 are within the scope of the present disclosure.

Additionally, or alternatively, a distance D2 between a bottom surface of the semiconductor die package 204 and a top surface of the dome-shaped structure 222 may be included in a range of approximately 9 microns to approximately 11 microns. If the distance D2 is less than approximately 9 microns, the dome-shaped structure 222 may interfere with a bottom surface of the semiconductor die package 204 to reduce a reliability of solder joints between the via structures 214 and the connection structures 220. If the distance D2 is greater than approximately 11 microns, an amount of the underfill material 226 between the dome-shaped structure 222 and the bottom surface of the semiconductor die package 204 may increase to impede heat transfer from semiconductor die package 202 (e.g., the SoC IC die 206) to the semiconductor die package 204 (e.g., to the DRAM IC die 218 for dissipation to the environment surrounding the multi-die package 200). However, other values and ranges for the distance D2 are within the scope of the present disclosure.

Additionally, or alternatively, a ratio of a distance D3 between surfaces of the semiconductor die package 204 and the semiconductor die package 202 to the thickness D1 of the dome-shaped structure 222 (e.g., D3:D1) may be included in a range of approximately 10:9 to approximately 10:1. If the ratio is less than approximately 10:9, the dome-shaped structure 222 may interfere with a bottom surface of the semiconductor die package 204 to reduce a reliability of solder joints between the via structures 214 and the connection structures 220. If the ratio is greater than approximately 10:1, an amount of the underfill material 226 between the dome-shaped structure 222 and the bottom surface of the semiconductor die package 204 may increase to impede heat transfer from semiconductor die package 202 (e.g., the SoC IC die 206) to the semiconductor die package 204 (e.g., to the DRAM IC die 218 for dissipation to the environment surrounding the multi-die package 200). However, other values and ranges for the ratio D3:D1 are within the scope of the present disclosure.

Additionally, or alternatively, a volume of the dome-shaped structure 222 may be included in a range of approximately 18% to approximately 22% of a volume of a space between a top surface of the semiconductor die package 202 and a bottom surface of the semiconductor die package 204. In other words, a volume of the thermally-conductive material included in the dome-shaped structure 222 may be included in a range of approximately 18% to approximately 22% of a volume of the underfill material 226. If the percentage is less than approximately 18%, an amount of the thermally-conductive material included the dome-shaped structure 222 may be insufficient to transfer heat from the semiconductor die package 202 (e.g., the SoC IC die 206) at a targeted heat transfer speed or rate. If the percentage is greater than approximately 22%, the dome-shaped structure 222 may interfere with a bottom surface of the semiconductor die package 204 to reduce a reliability of solder joints between the via structures 214 and the connection structures 220. However, other values and ranges for the percentage are within the scope of the present disclosure.

FIG. 2B illustrates a top view of the semiconductor die package 202. FIG. 2B shows the SoC IC die 206, the via structures 214, and the dome-shaped structure 222.

As shown in FIG. 2B, the dome-shaped structure 222 may be located within a central region of the SoC IC die 206. In some implementations, an area (e.g., a coverage area) of the dome-shaped structure 222 may be equal to or greater than approximately 10% of an area of the SoC IC die 206. If the area is less than approximately 10% of the area of the SoC IC die 206, a thermal-conductivity of the dome-shaped structure 222 (e.g., a thermal conductivity) may be insufficient to transfer heat from the semiconductor die package 202 (e.g., the SoC IC die 206) to the semiconductor die package 204 at a targeted heat transfer speed or rate. Additionally, or alternatively, a transient response (e.g., a transient thermal response) of a multi-die package (e.g., the multi-die package 200) including the semiconductor die package 202 may be insufficient to maintain a junction temperature of the SoC IC die 206 during power cycling (e.g., satisfy a junction temperature threshold during a duty cycle of the SoC IC die 206). However, other values and ranges for the coverage area are within the scope of the present disclosure.

FIG. 2C shows a side view of an example implementation of the multi-die package 200 including multiple memory IC die (e.g., the DRAM IC die 218b on the DRAM IC die 218a) within the semiconductor die package 204. In such a case, the semiconductor die package 204 may correspond to a memory die stack structure. The DRAM IC die 218a and the DRAM IC die 218b may correspond to flipchip type of IC dies that are connected through traces and/or RDL on a topo surface of the DRAM IC die 218a, among other examples.

In FIG. 2C, and in addition to the dome-shaped structure 222a on the SoC IC die 206, the multi-die package 200 may include the dome-shaped structure 222b on the DRAM IC die 218a. The dome-shaped structures 222a and 222b may spread heat 224 emanating from the SoC IC die 206 and/or the DRAM IC die 218a and transfer the heat 224 to the DRAM IC die 218b for dissipation to an environment surrounding the multi-die package 200. In some implementations, a variation of the multi-die package 200 of FIG. 2C includes or more memory die only (e.g., a memory die stack structure) and exclude the semiconductor die package 202 (e.g., the semiconductor die package 202 including the SoC IC die 206).

As described by FIGS. 2A-2C, in some implementations the multi-die package 200 includes a bottom semiconductor die package (e.g., the semiconductor die package 202). The multi-die package 200 includes a heat transfer component (e.g., the dome-shaped structure 222) having a convex-shaped surface and a thermally-conductive material on atop surface of the bottom semiconductor die package.

The multi-die package 200 includes atop semiconductor die package (e.g., the semiconductor die package 204) above the bottom semiconductor die package and having a bottom surface above the convex-shaped surface of the heat transfer component. The multi-die package 200 includes the underfill material 226 between the bottom surface of the top semiconductor die package and the convex-shaped surface of the heat transfer component.

Additionally, or alternatively, the multi-die package 200 includes an InFO package (e.g., the semiconductor die package 202) including the SoC IC die 206. The multi-die package 200 includes the DRAM IC die 218 (e.g., a dynamic random access memory integrated circuit die package) connected to the vertical interconnect access structures 214 of the InFO package. The multi-die package 200 includes a conduction-based heat transfer component (e.g., the dome-shaped structure 222) connected to a top surface of the InFO package, where the conduction-based heat transfer component includes an epoxy solder paste material.

As indicated above, FIGS. 2A-2C are provided as an examples. Other examples may differ from what is described with regard to FIGS. 2A-2C.

FIG. 3 is a diagram of an example implementation 300 of the multi-die package 200 described herein. In particular, the example implementation 300 includes a thermal circuit 302. The thermal circuit 302 includes a series of thermal resistances 304, 306, and 308 (e.g., thermal resistances in W/m·K, among other examples).

The thermal resistance 304 may correspond to a thermal resistance of the SoC IC die 206. The thermal resistance 306 may correspond to a combined thermal resistance of the dome-shaped structure 222 and the underfill material 226. The thermal resistance 308 may correspond to a thermal resistance of the DRAM IC die 218.

During operation (e.g., during a duty cycle) of the SoC IC die 206, the thermal circuit 302 including the dome-shaped structure 222 spreads heat 224 emanating from the SoC IC die 206 and transfers the heat 224 to the DRAM IC die 218 for dissipation to an environment surrounding the multi-die package 200. In some implementations, an amount of the heat 224 (e.g., a flux of the heat 224) emanating from the SoC IC die 206 may be included in a range of approximately 50 watts per square centimeter (W/cm$^2$) to approximately 100 W/cm$^2$. However, other values and ranges for the amount of the heat 224 emanating from the SoC IC die 206 are within the scope of the present disclosure.

By spreading and transferring the heat 224, the thermal circuit 302 including the dome-shaped structure 222 may enable the SoC IC die 206 to satisfy a junction temperature threshold (a temperature of a diode within the SoC IC die 206) during operation of the SoC IC die 206. In the thermal circuit 302, the junction temperature may correspond to a temperature of a node 310 within the thermal circuit 302. In some implementations, the junction temperature threshold, which may correspond to an upper operating temperature threshold, is included in a range of approximately 100 degrees Celsius (° C.) to approximately 110° C. If the junction temperature threshold is greater than approximately 100° C. to approximately 110° C., a performance of the SoC IC die 206 (e.g., a computing speed or a reliability of the SoC IC die 206, among other examples) may be reduced. However, other values and ranges for the junction temperature threshold are within the scope of the present disclosure.

The thermal circuit 302 is configured to quickly spread and transfer the heat 224 within the multi-die package 200. Satisfying the junction temperature threshold may increase a performance of the SoC IC die 206 (e.g., a computing speed of the SoC IC die 206) and/or increase a reliability of the SoC IC die 206 relative to another SoC IC die included in another multi-die package not including the thermal circuit 302 (e.g., not including thermal circuit 302 having the dome-shaped structure 222).

As indicated above, FIG. 3 is provided as an example. Other examples may differ from what is described with regard to FIG. 3.

FIGS. 4A-4F are diagrams of an example implementation 400 described herein. In particular, the example implementation 400 includes an example process for forming one or more portions of the multi-die package 200.

Figure 4A:
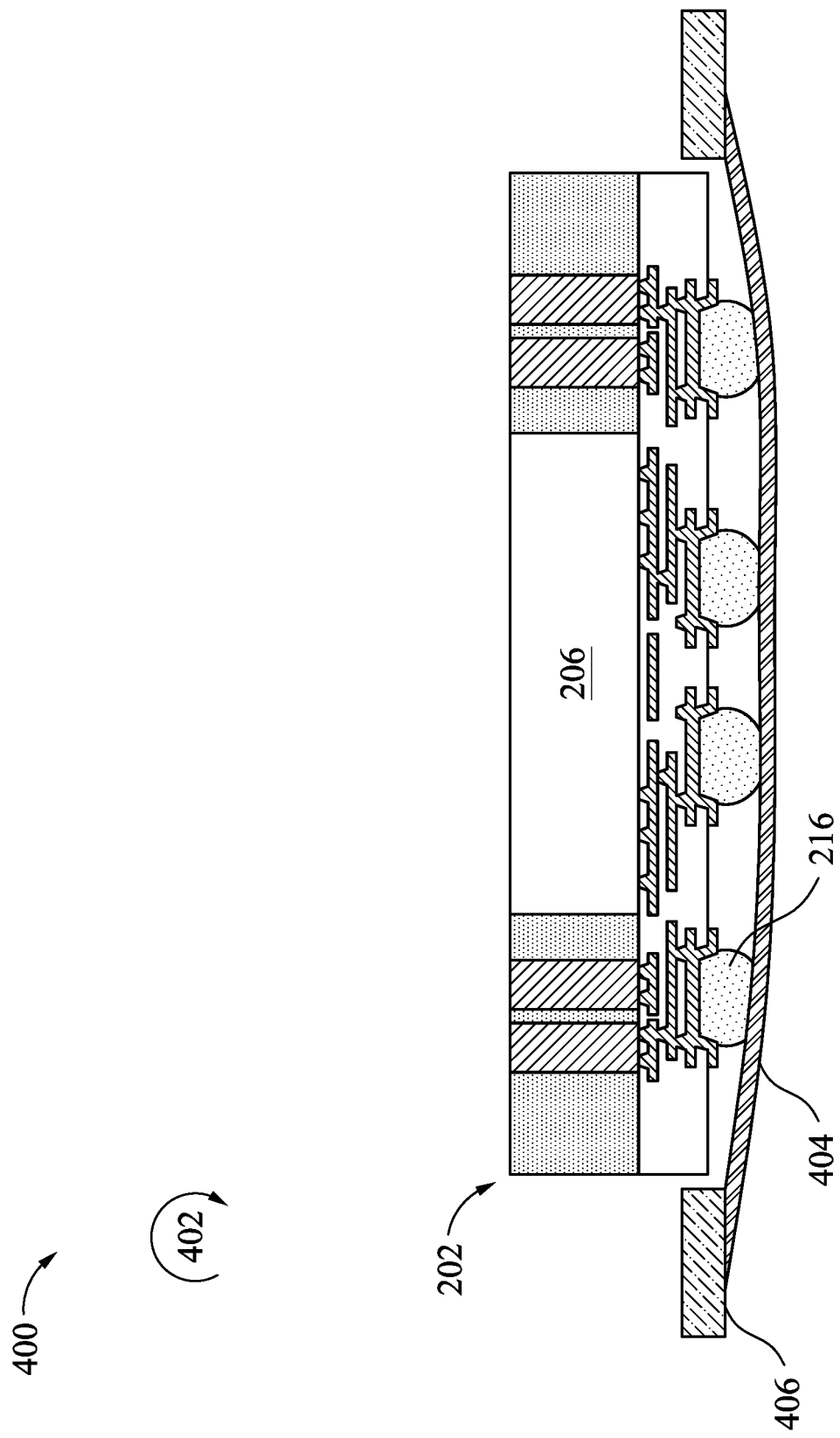
FIGS. 4A-4F are diagrams of an example implementation described herein.

As shown in FIG. 4A, an operation 402 includes attaching a substrate including semiconductor die package 202 to a dicing tape 404. In some implementations, the dicing tape 404 is supported by a film-frame carrier 406. As an example, the pick-and-place tool of the die-attach tool set 130 may attach a substrate (e.g., an InFO substrate, among other examples) including semiconductor die package 202 to the dicing tape 404, among other examples. As shown in FIG. 4A, the connection structures 216 contact the dicing tape 404.

Figure 4B:
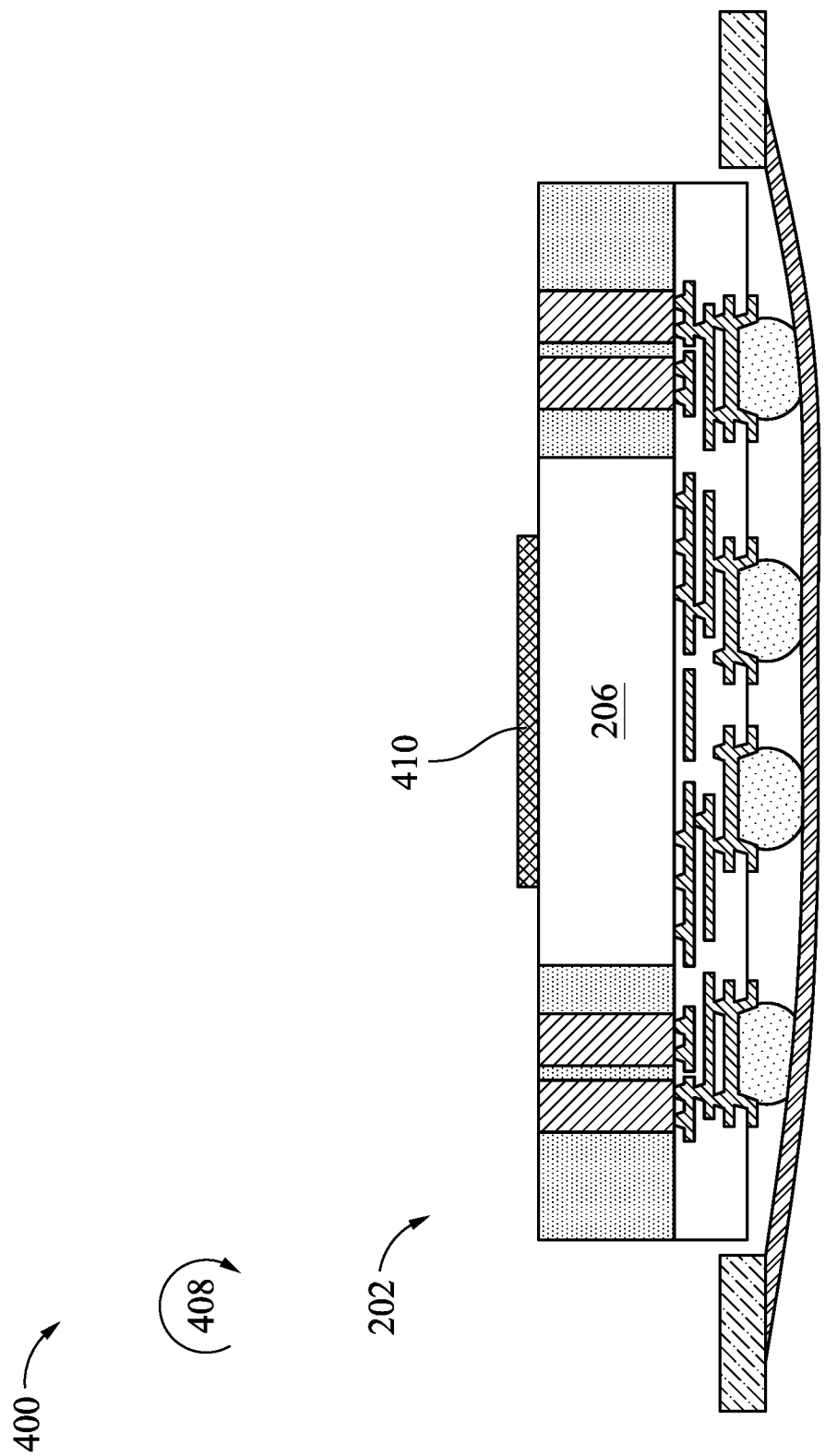

As shown in FIG. 4B, an operation 408 includes forming a deposit of a thermally-conductive material 410 on a top surface of the semiconductor die package 202. As an example, the stencil tool of the SMT tool set 145 may print the deposit of the thermally-conductive material 410 using a solder paste printing technique among other examples. In some implementations, the top surface of the semiconductor die package 202 corresponds to a top surface of the SoC IC die 206. Additionally, or alternatively, the deposit of the thermally-conductive material 410 may correspond to a disc-shaped structure with a flat surface.

Figure 4C:
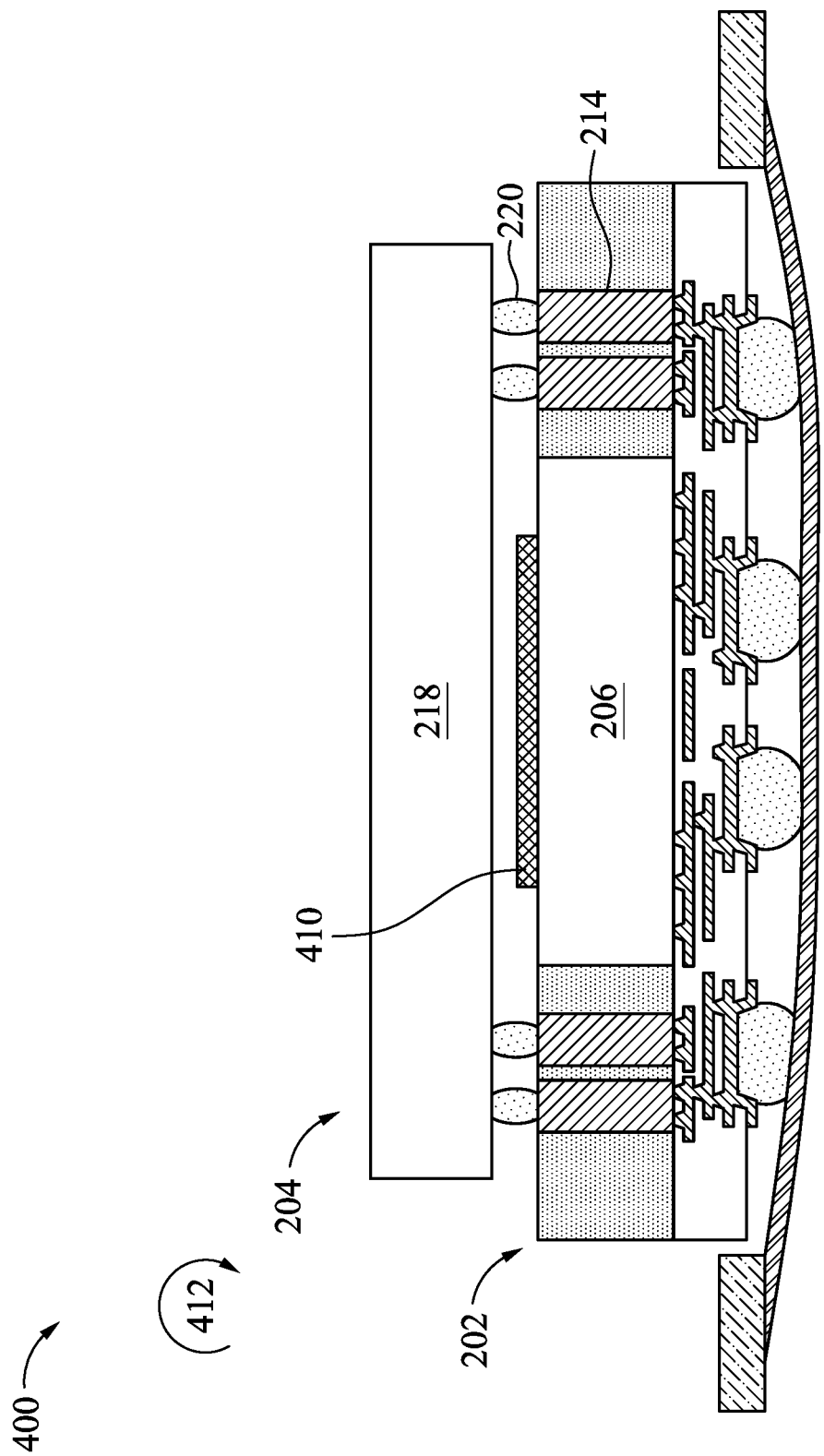

As shown in FIG. 4C, an operation 412 includes attaching the semiconductor die package 204 above the top surface of the semiconductor die package 202. As an example, the pick-and-place and reflow tools of the die-attach tool set 130 may attach the semiconductor die package 204 above the top surface of the semiconductor die package 202 using the connection structures 220 as standoffs to separate a bottom surface of the semiconductor die package 204 from the deposit of the thermally-conductive material 410. As shown in FIG. 4C, the connection structures 220 attach to the via structures 214.

Figure 4D:
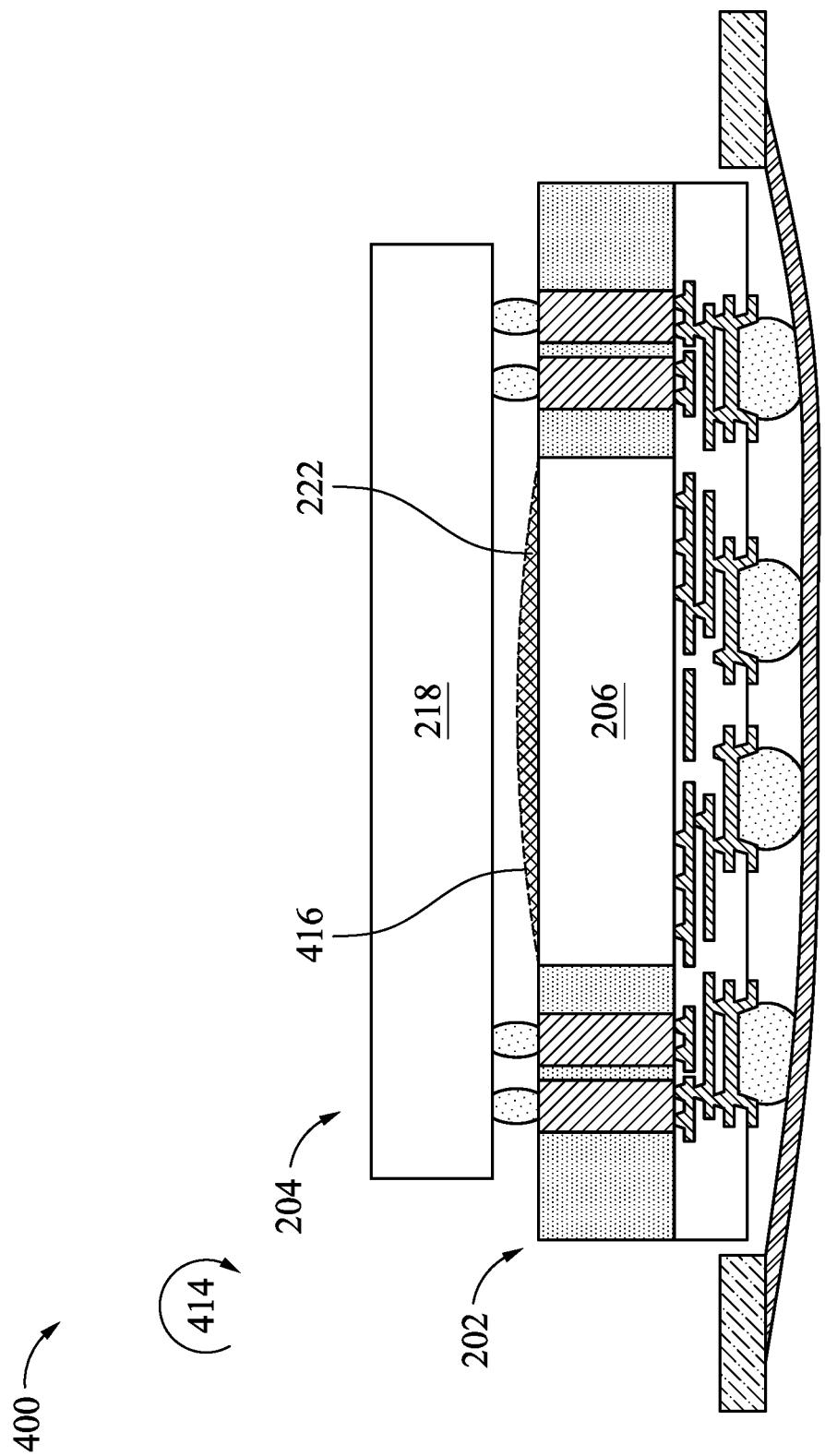

As shown in FIG. 4D, an operation 414 includes reforming the deposit of the thermally-conductive material 410 into the dome-shaped structure 222. As an example, the reflow tool of the of the die-attach tool set 130 may increase a temperature of an environment surrounding the deposit of the thermally-conductive material 410 to greater than approximately 150° C. to reflow (e.g., "wet") the deposit of the thermally-conductive material 410. Additionally, or alternatively, a laser tool of the die-attach tool set 130 may heat (e.g., liquefy) the deposit of the thermally-conductive material 410 to form the dome-shaped structure 222.

During the operation 414 (e.g., during reflow and/or heating), surface tension forces may reform the deposit of the thermally-conductive material 410 into the dome-shaped structure 222. The dome-shaped structure 222, which may solidify during cooling as part of the operation 414, may include a curved top surface 416 (e.g., a convex-shaped surface).

Figure 4E:
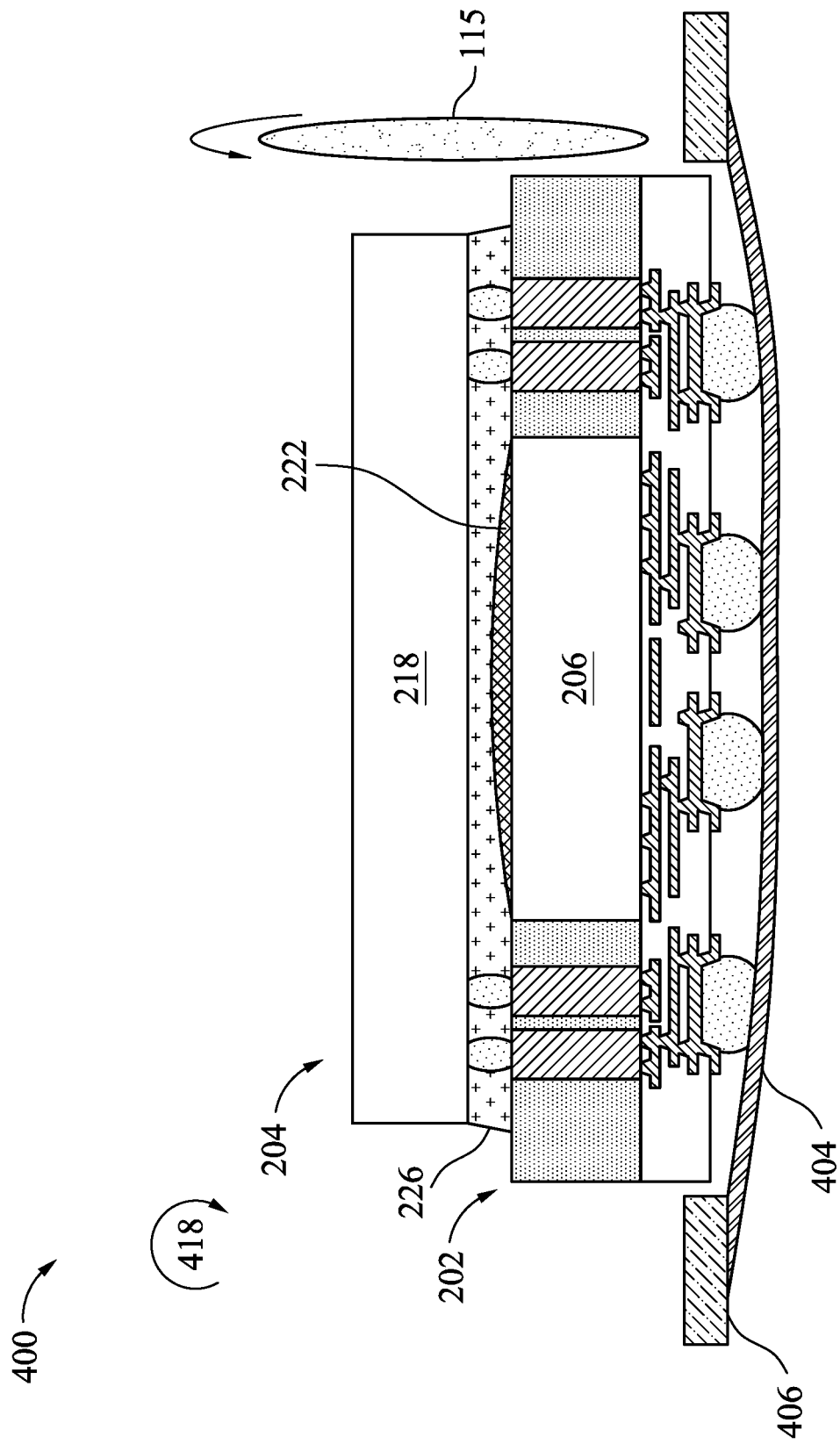

As shown in FIG. 4E, an operation 418 includes forming the underfill material 226 between the semiconductor die package 202 and the semiconductor die package 204. As an example, the dispense tool of the encapsulation tool set 135 may dispense the underfill material 226 as part of forming the underfill material 226 between the semiconductor die package 202 and the semiconductor die package 204. In some implementations, and as shown in FIG. 4E, the underfill material 226 envelops (e.g., covers) the dome-shaped structure 222.

Additionally, or alternatively and as part of operation 418, a tool of the singulation tool set 125 (e.g., the dicing tool or the sawing tool, among other examples) may separate the semiconductor die package 202 (and the semiconductor die package 204 attached to the semiconductor die package 202) from the substrate attached to the dicing tape 404.

Figure 4F:
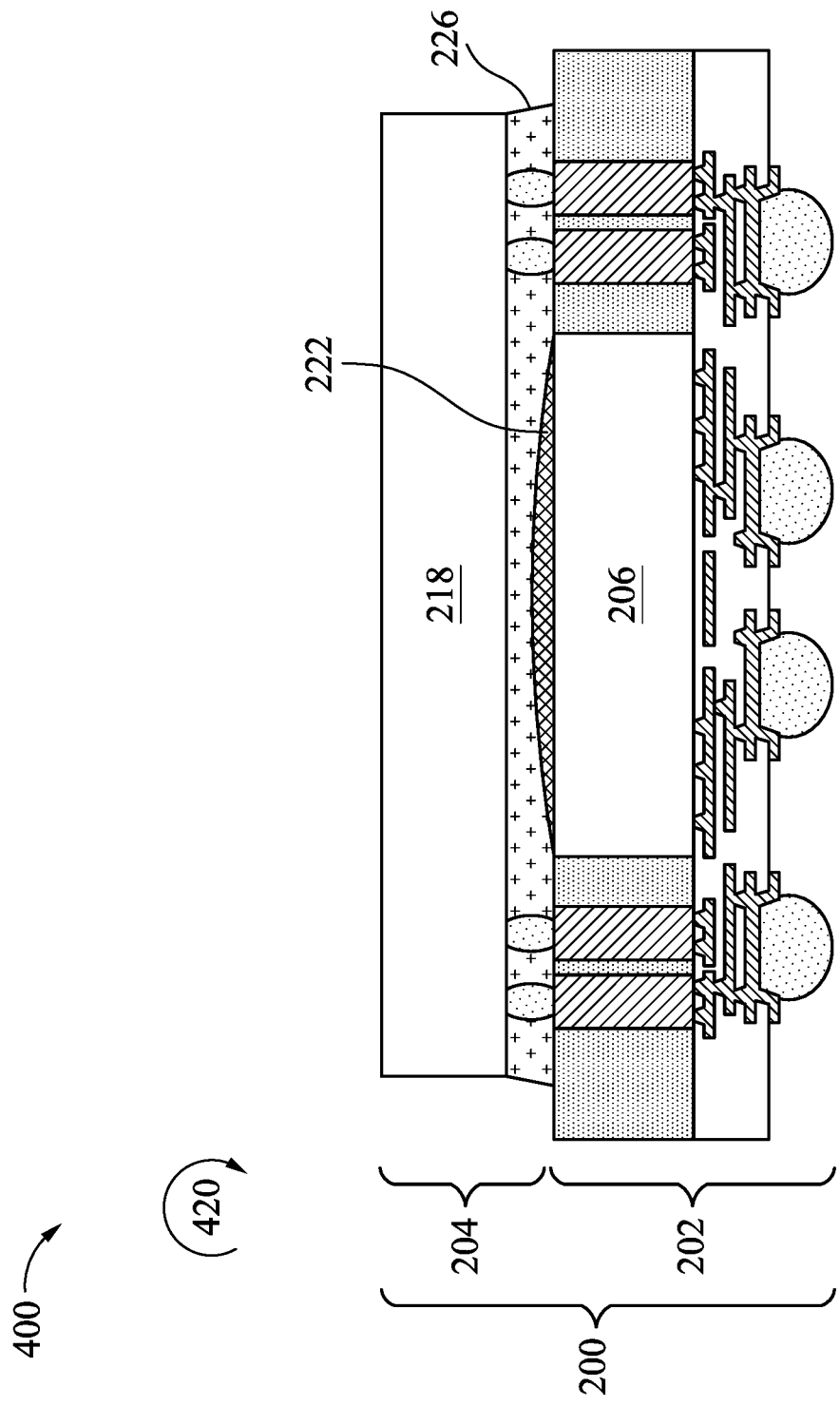

As shown in FIG. 4F, an operation 420 includes removing the multi-die package 200 from the dicing tape 404. As an example, the pick-and-place tool of the die-attach tool set 130 may remove the multi-die package 200 from the dicing tape 404. The multi-die package 200, as shown in FIG. 4F, includes the semiconductor die package 204 (including the DRAM IC die 218) over the semiconductor die package 202 (including the SoC IC die 206). The multi-die package 200 further includes the dome-shaped structure 222 enveloped by the underfill material 226.

As indicated above, FIGS. 4A-4F are provided as examples. Other examples may differ from what is described with regard to FIGS. 4A-4F.

Figure 5:
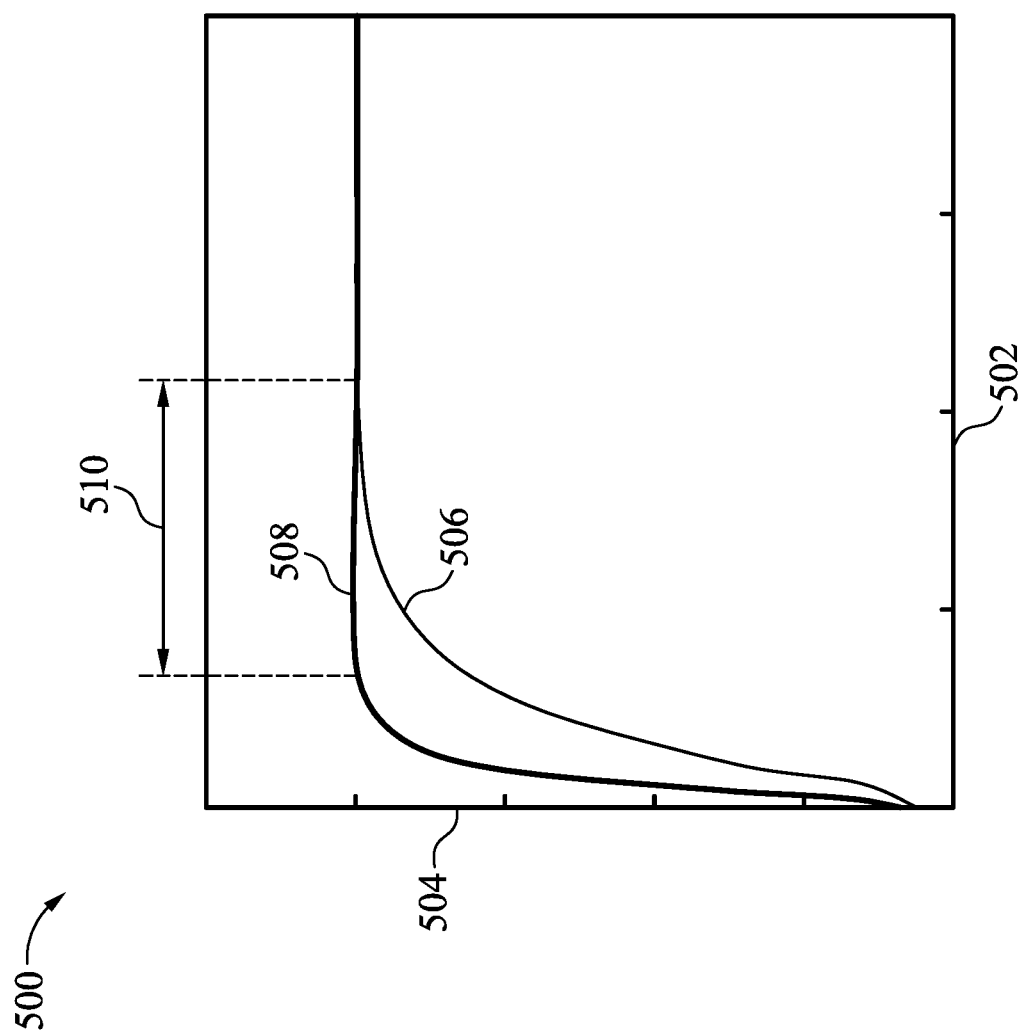
FIG. 5 is a diagram of an example transient responses of thermal circuits described herein.

FIG. 5 is a diagram 500 of an example transient responses of thermal circuits described herein. The diagram 500 includes a mapping of a time 502 (e.g., a time in seconds) versus a junction temperature 504 (a temperature in ° C.) of an IC die (e.g., the DRAM IC die 218) during operation of a multi-die package (e.g., the multi-die package 200). The diagram 500 may correspond to how quickly heat is transferred to the IC die from another IC die in the multi-die package (e.g., how quickly the heat 224 is transferred from the SoC IC die 206 to the DRAM IC die 218).

As shown in FIG. 5, a transient response 506 may be associated with a multi-die package (e.g., the multi-die package 200) having a thermal circuit that excludes a dome-shaped structure (e.g., a thermal circuit excluding the dome-shaped structure 222). In contrast, a transient response 508 may be associated with the multi-die package having a thermal circuit that includes the dome-shaped structure (e.g., the thermal circuit 302 including the dome-shaped structure 222).

As shown in FIG. 5, the transient response 508 may show a response-time reduction 510 relative to the transient response 506. In some implementations, the response-time reduction 510 may correspond to a reduction in heating time of the IC device (e.g., a reduction in heating time of the DRAM IC die 218) by up to approximately 60%. Such a reduction may be indicative of an increase in a rate of heat transfer from the other IC device (e.g., the SoC IC die 206) to the IC device (e.g., to the DRAM IC die 218) to maintain a junction temperature of the other IC device at or below a junction temperature threshold. However, other values and ranges for the response-time reduction 510 are within the scope of the present disclosure.

As indicated above, FIG. 5 is provided as an example. Other examples may differ from what is described with regard to FIG. 5.

Figure 6:
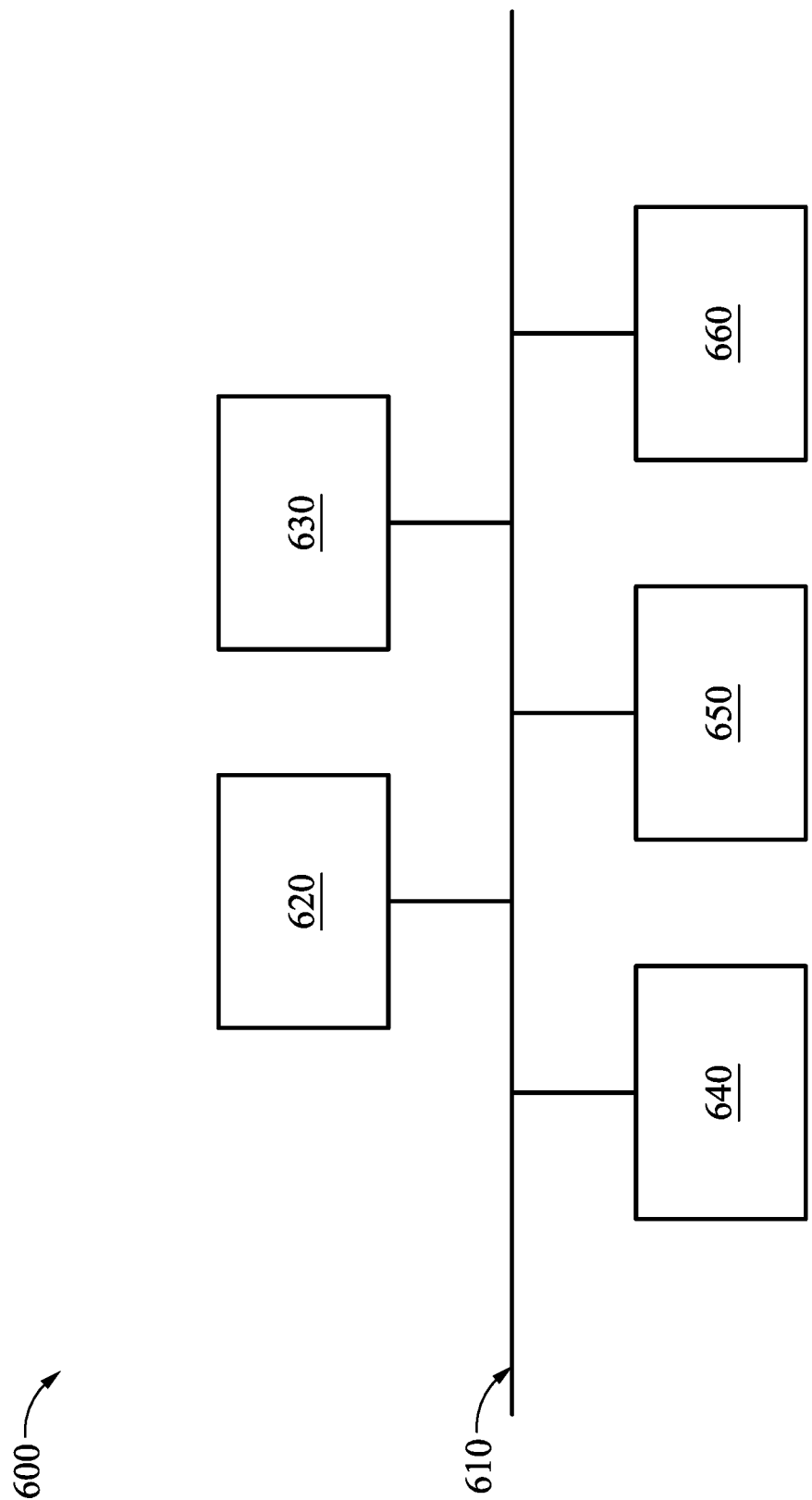
FIG. 6 is a diagram of example components of a device described herein.

FIG. 6 is a diagram of example components of a device 600 described herein. In some implementations, one or more of the semiconductor processing tool sets 105-150 and/or the transport tool set 155 may include one or more devices 600 and/or one or more components of device 600. As shown in FIG. 6, device 600 may include a bus 610, a processor 620, a memory 630, an input component 640, an output component 650, and a communication component 660.

Bus 610 may include one or more components that enable wired and/or wireless communication among the components of device 600. Bus 610 may couple together two or more components of FIG. 6, such as via operative coupling, communicative coupling, electronic coupling, and/or electric coupling. Processor 620 may include a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 may include one or more processors capable of being programmed to perform one or more operations or processes described elsewhere herein.

Memory 630 may include volatile and/or nonvolatile memory. For example, memory 630 may include random access memory (RAM), read only memory (ROM), a hard disk drive, and/or another type of memory (e.g., a flash memory, a magnetic memory, and/or an optical memory). Memory 630 may include internal memory (e.g., RAM, ROM, or a hard disk drive) and/or removable memory (e.g., removable via a universal serial bus connection). Memory 630 may be a non-transitory computer-readable medium. Memory 630 stores information, instructions, and/or software (e.g., one or more software applications) related to the operation of device 600. In some implementations, memory 630 may include one or more memories that are coupled to one or more processors (e.g., processor 620), such as via bus 610.

Input component 640 enables device 600 to receive input, such as user input and/or sensed input. For example, input component 640 may include a touch screen, a keyboard, a keypad, a mouse, a button, a microphone, a switch, a sensor, a global positioning system sensor, an accelerometer, a gyroscope, and/or an actuator. Output component 650 enables device 600 to provide output, such as via a display, a speaker, and/or a light-emitting diode. Communication component 660 enables device 600 to communicate with other devices via a wired connection and/or a wireless connection. For example, communication component 660 may include a receiver, a transmitter, a transceiver, a modem, a network interface card, and/or an antenna.

Device 600 may perform one or more operations or processes described herein. For example, a non-transitory computer-readable medium (e.g., memory 630) may store a set of instructions (e.g., one or more instructions or code) for execution by processor 620. Processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry is used instead of or in combination with the instructions to perform one or more operations or processes described herein. Additionally, or alternatively, processor 620 may be configured to perform one or more operations or processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
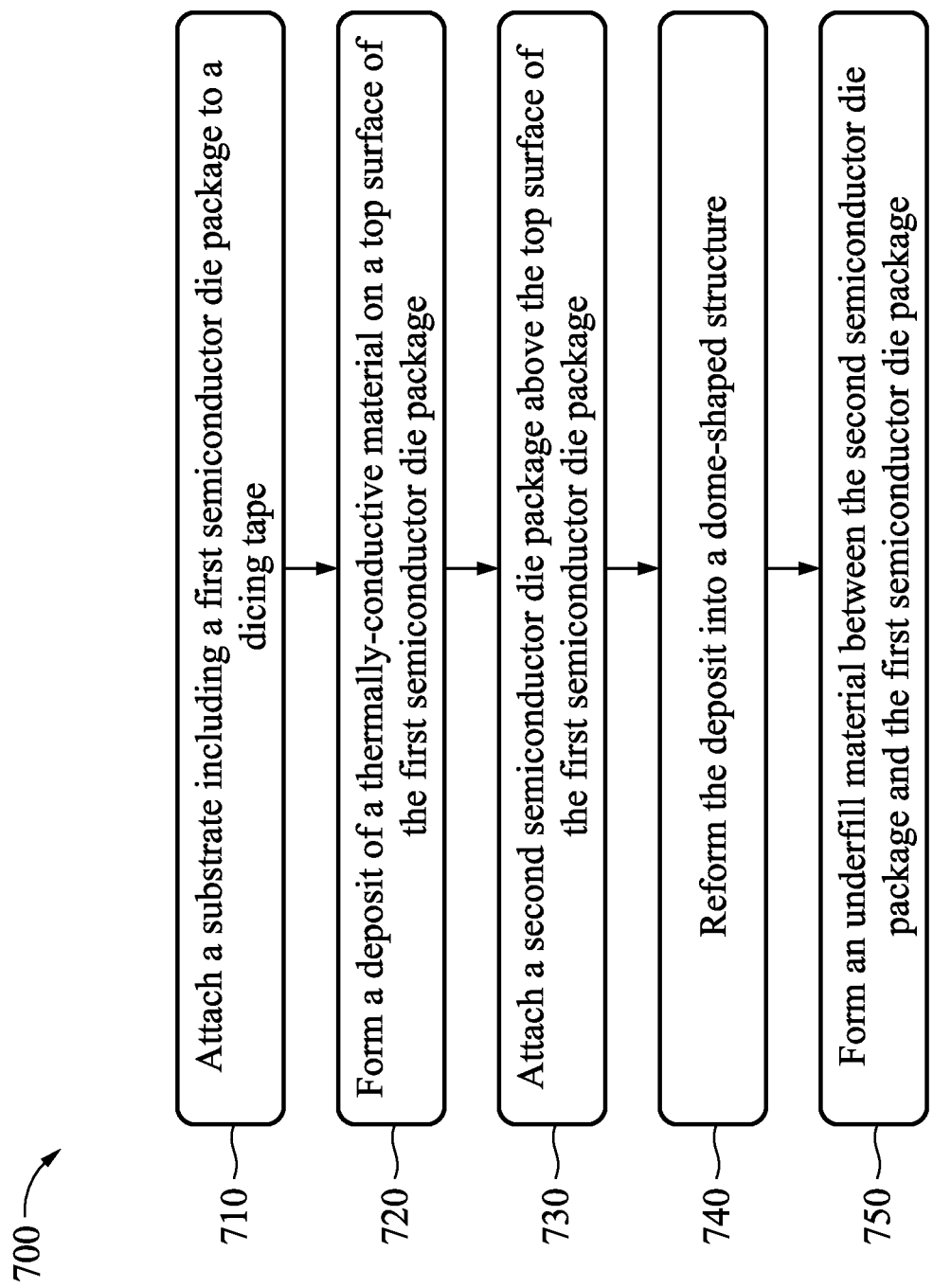
FIG. 7 is a flowchart of an example process associated with forming a semiconductor die package.

FIG. 7 is a flowchart of an example process 700 associated with forming a semiconductor die package. In some implementations, one or more process blocks of FIG. 7 are performed by one or more semiconductor processing tool sets (e.g., one or more of the semiconductor processing tool sets 105-150). Additionally, or alternatively, one or more process blocks of FIG. 7 may be performed by one or more components of device 600, such as processor 620, memory 630, input component 640, output component 650, and/or communication component 660.

As shown in FIG. 7, process 700 may include attaching a substrate including a first semiconductor die package to a dicing tape (block 710). For example, one or more of the semiconductor processing tool sets 105-150, such as the die-attach tool set 130, may attach a substrate including a first semiconductor die package (e.g., the semiconductor die package 202) to a dicing tape 404 supported by a film-frame carrier 406, as described above.

As further shown in FIG. 7, process 700 may include forming a deposit of a thermally-conductive material on a top surface of the first semiconductor die package (block 720). For example, the one or more of the semiconductor processing tool sets 105-150, such as the SMT tool set 145, may form the deposit of the thermally-conductive material 410 on a top surface of the first semiconductor die package, as described above.

As further shown in FIG. 7, process 700 may include attaching a second semiconductor die package above the top surface of the first semiconductor die package (block 730). For example, one or more of the semiconductor processing tool sets 105-150, such as the die-attach tool set 130, may attach a second semiconductor die package (e.g., the semiconductor die package 204) above the top surface of the first semiconductor die package, as described above. In some implementations, a bottom surface of the second semiconductor die package and a top surface of the deposit of the thermally-conductive material 410 are disconnected.

As further shown in FIG. 7, process 700 may include reforming the deposit into a dome-shaped structure (block 740). For example, one or more of the semiconductor processing tool sets 105-150, such as the die-attach tool set 130, may reform the deposit of the thermally-conductive material 410 into a dome-shaped structure 222, as described above. In some implementations, the bottom surface of the second semiconductor die package and a curved top surface of the dome-shaped structure 222 are disconnected.

As further shown in FIG. 7, process 700 may include forming an underfill material between the second semiconductor die package and the first semiconductor die package (block 750). For example, the one or more of the semiconductor processing tool sets 105-150, such as the encapsulation tool set 135, may form an underfill material 226 between the second semiconductor die package and the first semiconductor die package, as described above. In some implementations, forming the underfill material envelops the dome-shaped structure 222.

Process 700 may include additional implementations, such as any single implementation or any combination of implementations described below and/or in connection with one or more other processes described elsewhere herein.

In a first implementation, forming the deposit of the thermally-conductive material 410 includes forming the deposit of the thermally-conductive material 410 using a solder paste printing technique.

In a second implementation, alone or in combination with the first implementation, reforming the deposit of the thermally-conductive material 410 into the dome-shaped structure 222 includes reforming the deposit of the thermally-conductive material 410 into the dome-shaped structure 222 using a solder paste reflow technique.

In a third implementation, alone or in combination with one or more of the first and second implementations, reforming the deposit of the thermally-conductive material 410 into the dome-shaped structure 222 includes forming the dome-shaped structure 222 by using a laser to heat the deposit of the thermally-conductive material 410.

In a fourth implementation, alone or in combination with one or more of the first through third implementations, reforming the deposit of the thermally-conductive material 410 into the dome-shaped structure 222 and forming the underfill material 226 between the bottom surface of the second semiconductor die package and the top surface of the first semiconductor die package includes forming a portion of a thermal circuit 302 (e.g., thermal path) configured to spread heat 224 emanating from the first semiconductor die package and transfer the heat 224 to the second semiconductor die package for dissipation to an environment surrounding the first semiconductor die package and the second semiconductor die package.

In a fifth implementation, alone or in combination with one or more of the first through fourth implementations, attaching the second semiconductor die package above the top surface of the first semiconductor die package includes attaching the second semiconductor die package using connection structures 220 that cause the bottom surface of the second semiconductor die package to be separated from an apex of the dome-shaped structure 222.

In a sixth implementation, alone or in combination with one or more of the first through fifth implementations, reforming the deposit of the thermally-conductive material 410 into the dome-shaped structure 222 includes reforming the deposit of the thermally-conductive material 410 into the dome-shaped structure 222 such that a coverage area of the dome-shaped structure is greater than approximately 10% of an area of an integrated circuit die (e.g., the SoC IC die 206) included in the first semiconductor die package.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

Some implementations described herein a provide a multi-die package and methods of formation. The multi-die package includes a DRAM IC die over an SoC IC die, and a heat transfer component between the SoC IC die and the DRAM IC die. The heat transfer component, which may correspond to a dome-shaped structure, may be on a surface of the SoC IC die and enveloped by an underfill material between the SoC IC die and the DRAM IC die. The heat transfer component, in combination with the underfill material, may be a portion of a thermal circuit having one or more thermal conductivity properties to quickly spread and transfer heat within the multi-die package so that a temperature of the SoC IC die satisfies a threshold.

The thermal circuit is configured to quickly spread and transfer heat within the multi-die package. In this way, heat is dissipated from the multi-die package so a temperature of the SoC IC die satisfies a junction temperature threshold. Satisfying the junction temperature threshold may increase a performance of the SoC IC die (e.g., a computing speed of the SoC IC die) and/or increase a reliability of the SoC IC die relative to another SoC IC die included in another multi-die package not including the heat transfer component.

As described in greater detail above, some implementations described herein provide a multi-die package. The multi-die package includes a bottom semiconductor die package. The multi-die package includes a heat transfer component having a convex-shaped surface and a thermally-conductive material on a top surface of the bottom semiconductor die package. The multi-die package includes a top semiconductor die package above the bottom semiconductor die package and having a bottom surface above the convex-shaped surface of the heat transfer component. The multi-die package includes an underfill material between the bottom surface of the top semiconductor die package and the convex-shaped surface of the heat transfer component.

As described in greater detail above, some implementations described herein provide a multi-die package. The multi-die package includes an InFO package including an SoC IC die. The multi-die package includes a DRAM IC die connected to vertical interconnect access structures of the InFO package. The multi-die package includes a conduction-based heat transfer component connected to a top surface of the InFO package, where the conduction-based heat transfer component includes an epoxy solder paste material.

As described in greater detail above, some implementations described herein provide a method. The method includes attaching a substrate including a first semiconductor die package to a dicing tape. The method includes forming a deposit of a thermally-conductive material on a top surface of the first semiconductor die package. The method includes attaching a second semiconductor die package above the top surface of the first semiconductor die package, where a bottom surface of the second semiconductor die package and a top surface of the deposit are disconnected. The method includes reforming the deposit into a dome-shaped structure, where the bottom surface of the second semiconductor die package and a curved top surface of the dome-shaped structure are disconnected. The method includes forming an underfill material between the bottom surface of the second semiconductor die package and the top surface of the first semiconductor die package, where forming the underfill material envelops the dome-shaped structure.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

As used herein, the term "and/or," when used in connection with a plurality of items, is intended to cover each of the plurality of items alone and any and all combinations of the plurality of items. For example, "A and/or B" covers "A and B," "A and not B," and "B and not A."

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   attaching a substrate including a first semiconductor die package to a dicing tape;
   forming a deposit of a thermally-conductive material on a top surface of the first semiconductor die package;
   attaching a second semiconductor die package above the top surface of the first semiconductor die package,
      wherein a bottom surface of the second semiconductor die package and a top surface of the deposit are disconnected;
   reforming the deposit into a dome-shaped structure,
      wherein the bottom surface of the second semiconductor die package and a curved top surface of the dome-shaped structure are disconnected; and
   forming an underfill material between the second semiconductor die package and the first semiconductor die package,
      wherein forming the underfill material envelops the dome-shaped structure, and
      wherein a thickness of the dome-shaped structure is included in a range of approximately 10 microns to approximately 110 microns.

2. The method of claim 1,
   wherein forming the deposit of the thermally-conductive material comprises:
      forming the deposit using a solder paste printing technique.

3. The method of claim 1,
   wherein reforming the deposit into the dome-shaped structure comprises:
      reforming the deposit into the dome-shaped structure using a solder paste reflow technique.

4. The method of claim 1,
   wherein reforming the deposit into the dome-shaped structure comprises:
      reforming the deposit into the dome-shaped structure by using a laser to heat the deposit.

5. The method of claim 1,
   wherein reforming the deposit into the dome-shaped structure and forming the underfill material between the bottom surface of the second semiconductor die package and the top surface of the first semiconductor die package comprises:
      forming a portion of a thermal circuit configured to spread heat emanating from the first semiconductor die package and transfer the heat to the second semiconductor die package for dissipation to an environment surrounding the first semiconductor die package and the second semiconductor die package.

6. The method of claim 1,
   wherein attaching the second semiconductor die package above the top surface of the first semiconductor die package comprises:
      attaching the second semiconductor die package using connection structures that cause the bottom surface of the second semiconductor die package to be separated from an apex of the dome-shaped structure.

7. The method of claim 1,
   wherein reforming the deposit into the dome-shaped structure comprises:
      reforming the deposit into the dome-shaped structure such that a coverage area of the dome-shaped structure is greater than approximately 10% of an area of an integrated circuit die included in the first semiconductor die package.

8. A method, comprising:
   adding a heat transfer component on a top surface of a bottom semiconductor die package, the heat transfer component comprising:
      a convex-shaped surface; and
      a thermally-conductive material;
   attaching a top semiconductor die package above the bottom semiconductor die package, the top semiconductor die package having a bottom surface above the convex-shaped surface of the heat transfer component; and
   adding an underfill material between the bottom surface of the top semiconductor die package and the convex-shaped surface of the heat transfer component,
      wherein a ratio of a distance between surfaces of the top semiconductor die package and the bottom semiconductor die package to a thickness of the heat transfer component is included in a range of approximately 10:9 to approximately 10:1.

9. The method of claim 8,
   wherein a thermal-conductivity of the thermally-conductive material is greater than or equal to approximately 65 watts per meter Kelvin.

10. The method of claim 8,
    wherein the thermally-conductive material comprises an epoxy solder paste material.

11. The method of claim 8,
    wherein the heat transfer component is included as part of a thermal path configured to dissipate heat emanating from a die included in the bottom semiconductor die package.

12. The method of claim 8,
    wherein a thickness of the heat transfer component is included in a range of approximately 10 microns to approximately 110 microns.

13. The method of claim 8,
    wherein a distance between the bottom surface of the top semiconductor die package and an apex of the convex-shaped surface is included in a range of approximately 9 microns to approximately 11 microns.

14. A method, comprising:

connecting a dynamic random access memory integrated circuit die package to vertical interconnect access structures of an integrated fan-out package, the integrated fan-out package including a system-on-chip integrated circuit die; and connecting a conduction-based heat transfer component to a top surface of the integrated fan-out package, the conduction-based heat transfer component comprising an epoxy solder paste material, wherein a volume of the epoxy solder paste material is included in a range of approximately 18% to approximately 22% of a volume of a space between surfaces of the integrated fan-out package and the dynamic random access memory integrated circuit die package.

15. The method of claim 14, further comprising:

adding an underfill material between the integrated fan-out package and the dynamic random access memory integrated circuit die package.

16. The method of claim 14, wherein the conduction-based heat transfer component includes a dome-shaped structure located between the system-on-chip integrated circuit die and the dynamic random access memory integrated circuit die package.

17. The method of claim 14, wherein the conduction-based heat transfer component is configured to spread heat originating from the system-on-chip integrated circuit die and transfer the heat to the dynamic random access memory integrated circuit die package for dissipation.

18. The method of claim 14, wherein the conduction-based heat transfer component is configured to maintain a junction temperature of the system-on-chip integrated circuit die at or below a junction temperature that is included in a range of approximately 100 degrees Celsius to approximately 110 degrees Celsius.

19. The method of claim 1, wherein a ratio of a distance between surfaces of the first semiconductor die package and the second semiconductor die package to a thickness of the dome-shaped structure is included in a range of approximately 10:9 to approximately 10:1.

20. The method of claim 1, wherein a distance between the bottom surface of the second semiconductor die package and an apex of the curved top surface is included in a range of approximately 9 microns to approximately 11 microns.

* * * * *